(12) United States Patent
Kuo et al.

(10) Patent No.: US 10,170,601 B2
(45) Date of Patent: Jan. 1, 2019

(54) STRUCTURE AND FORMATION METHOD OF SEMICONDUCTOR DEVICE WITH BIPOLAR JUNCTION TRANSISTOR

(71) Applicant: Taiwan Semiconductor Manufacturing Co., Ltd., Hsinchu (TW)

(72) Inventors: Chun-Tsung Kuo, Tainan (TW); Chuan-Feng Chen, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 3 days.

(21) Appl. No.: 15/697,150

(22) Filed: Sep. 6, 2017

(65) Prior Publication Data

US 2018/0166564 A1 Jun. 14, 2018

Related U.S. Application Data

(60) Provisional application No. 62/433,543, filed on Dec. 13, 2016.

(51) Int. Cl.

| | |
|---|---|
| *H01L 21/70* | (2006.01) |
| *H01L 29/732* | (2006.01) |
| *H01L 29/06* | (2006.01) |
| *H01L 29/08* | (2006.01) |
| *H01L 29/66* | (2006.01) |
| *H01L 29/16* | (2006.01) |
| *H01L 29/10* | (2006.01) |

(52) U.S. Cl.
CPC .......... *H01L 29/7325* (2013.01); *H01L 29/06* (2013.01); *H01L 29/0649* (2013.01); *H01L 29/08* (2013.01); *H01L 29/0804* (2013.01); *H01L 29/0821* (2013.01); *H01L 29/10* (2013.01); *H01L 29/1004* (2013.01); *H01L 29/16* (2013.01); *H01L 29/66* (2013.01); *H01L 29/66234* (2013.01); *H01L 29/732* (2013.01)

(58) Field of Classification Search
USPC .................................. 438/336–349; 257/526
See application file for complete search history.

(56) References Cited

U.S. PATENT DOCUMENTS

| | | | | |
|---|---|---|---|---|
| 5,432,104 A | * | 7/1995 | Sato | .................... H01L 29/0821 148/DIG. 10 |
| 6,686,250 B1 | * | 2/2004 | Kalnitsky | ......... H01L 29/66242 257/E21.371 |
| 2002/0158311 A1 | * | 10/2002 | Ohnishi | ............ H01L 29/66242 257/591 |

\* cited by examiner

*Primary Examiner* — Brook Kebede
(74) *Attorney, Agent, or Firm* — Birch, Stewart, Kolasch & Birch, LLP

(57) ABSTRACT

A semiconductor device structure is provided. The semiconductor device structure includes a collector element formed in or over a semiconductor substrate. The semiconductor device structure also includes a semiconductor element over the collector element, and the semiconductor element has a top surface, a bottom surface, and a side surface. The semiconductor device structure further includes an emitter element over the top surface of the semiconductor element. In addition, the semiconductor device structure includes a base element over the collector element and in direct contact with the side surface of the semiconductor element.

20 Claims, 9 Drawing Sheets

STRUCTURE AND FORMATION METHOD OF SEMICONDUCTOR DEVICE WITH BIPOLAR JUNCTION TRANSISTOR

PRIORITY CLAIM AND CROSS-REFERENCE

This application claims the benefit of U.S. Provisional Application No. 62/433,543, filed on Dec. 13, 2016, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
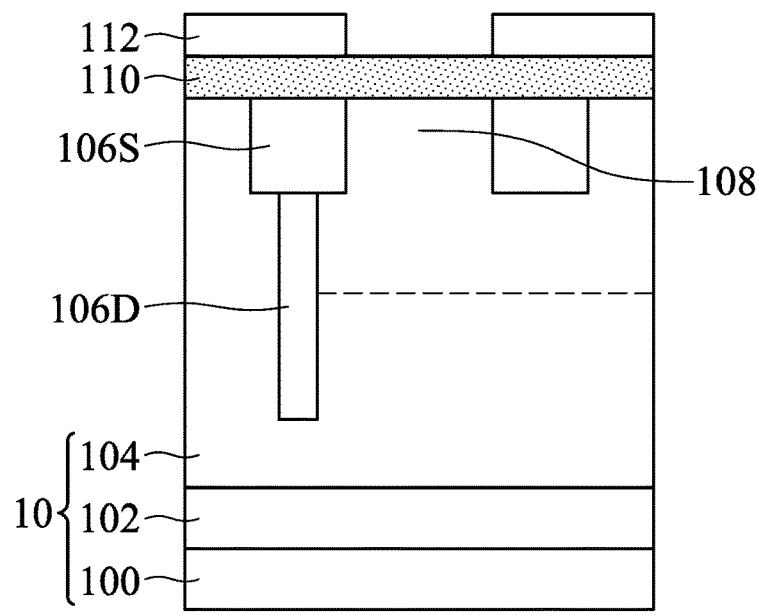
FIGS. 1A-1G are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1G are cross-sectional views of various stages of a process for forming a semiconductor device structure, in accordance with some embodiments. As shown in FIG. 1A, a substrate 10 such as a semiconductor substrate is received or provided. In some embodiments, the substrate 10 is a bulk semiconductor substrate, such as a semiconductor wafer. For example, the substrate 10 is a silicon wafer. The substrate 10 may include silicon or another elementary semiconductor material such as germanium. In some other embodiments, the substrate 10 includes a compound semiconductor. The compound semiconductor may include gallium arsenide, silicon carbide, indium arsenide, indium phosphide, another suitable material, or a combination thereof.

In some embodiments, the substrate 10 includes a semiconductor-on-insulator (SOI) substrate. The SOI substrate may be fabricated using a separation by implantation of oxygen (SIMOX) process, a wafer bonding process, another applicable method, or a combination thereof. In some embodiments, the substrate 10 includes a semiconductor base substrate 100, an insulator layer 102, and a semiconductor substrate 104, as shown in FIG. 1A.

As shown in FIG. 1A, isolation structures including isolation structures 106D and 106S are formed in the semiconductor substrate 104, in accordance with some embodiments. The isolation structures 106S may be shallow trench isolation features, and the isolation structure 106D may be a deep trench isolation feature. The isolation structures 106S and 106D are used to define and electrically isolate various device elements formed in and/or over the semiconductor substrate 104.

As shown in FIG. 1A, a collector element 108 (or a collector region) is formed in the semiconductor substrate 104, in accordance with some embodiments. In some embodiments, the collector element 108 is an n-type doped region for an NPN bipolar junction transistor. In some other embodiments, the collector element 108 is a p-type doped region for a PNP bipolar junction transistor. In some embodiments, the collector element 108 is formed using an ion implantation process, a diffusion process, or another applicable process.

As shown in FIG. 1A, an insulating layer 110 is deposited over the semiconductor substrate 104, in accordance with some embodiments. The insulating layer 110 may be made of or includes silicon oxide, silicon oxynitride, silicon nitride, silicon carbide, another suitable material, or a combination thereof. The insulating layer 110 may be deposited using a chemical vapor deposition (CVD) process, a thermal oxidation process, another applicable process, or a combination thereof.

Afterwards, a mask layer 112 is formed over the insulating layer 110, as shown in FIG. 1A in accordance with some embodiments. The mask layer 112 is used to assist in a subsequent patterning process of the insulating layer 110. The mask layer 112 may include one or more openings that expose the insulating layer 110. The mask layer 112 may be a patterned photoresist layer.

Figure 1B:
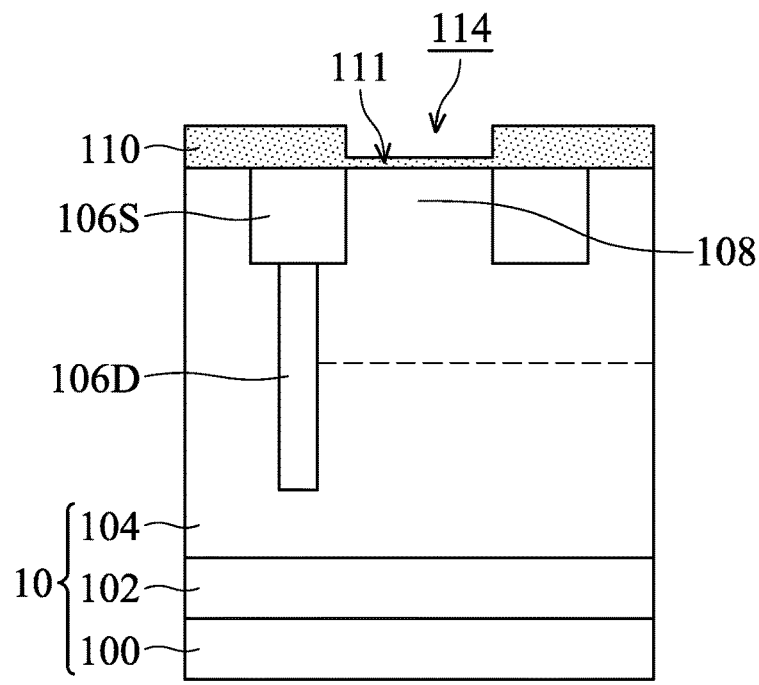

As shown in FIG. 1B, the insulating layer 110 is patterned to form a recess 114, in accordance with some embodiments. In some embodiments, with the mask layer 112 as an etch mask, an etching process is used to form the recess 114. In some embodiments, the recess 114 does not penetrate through the insulating layer 110 completely. A recessed portion 111 of the insulating layer 110 is between the bottom of the recess 114 and the collector element 108.

Figure 1C:
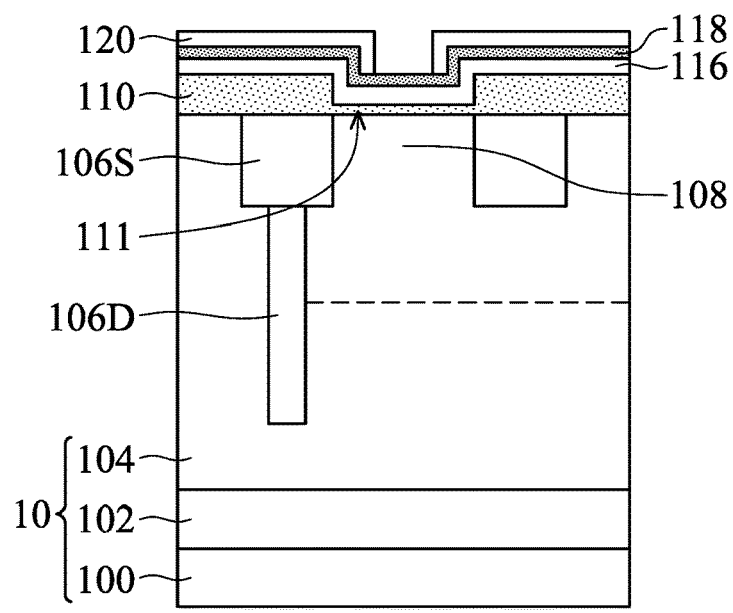

As shown in FIG. 1C, a base semiconductor layer 116 is formed over the insulating layer 110, in accordance with some embodiments. In some embodiments, the base semiconductor layer 116 extends into the recess 114. The base semiconductor layer 116 extends along the sidewalls and bottom of the recess 114. In some embodiments, the base semiconductor layer 116 conformally extends along the sidewall and the bottom of the recess 114.

In some embodiments, the base semiconductor layer 116 includes or is made of polysilicon. In some embodiments, the base semiconductor layer 116 is a p-type doped polysilicon layer for an NPN bipolar junction transistor. In some other embodiments, the base semiconductor layer 116 is an n-type doped polysilicon layer for a PNP bipolar junction transistor. The base semiconductor layer 116 may be formed using a CVD process or another applicable process.

Afterwards, a protective layer 118 is deposited over the base semiconductor layer 116, as shown in FIG. 1C in accordance with some embodiments. In some embodiments, the protective layer 118 is an insulating layer. In some embodiments, the protective layer 118 is made of or includes silicon nitride, silicon oxynitride, silicon carbide, another suitable material, or a combination thereof. The protective layer 118 may be deposited using a CVD process, a spin-on process, another applicable process, or a combination thereof.

Afterwards, a mask layer 120 is formed over the protective layer 118, as shown in FIG. 1C in accordance with some embodiments. The mask layer 120 is used to assist in a subsequent patterning process of the protective layer 118 and the base semiconductor layer 116. The mask layer 120 may include one or more openings that expose the protective layer 118. The mask layer 120 may be a patterned photoresist layer.

Figure 1D:
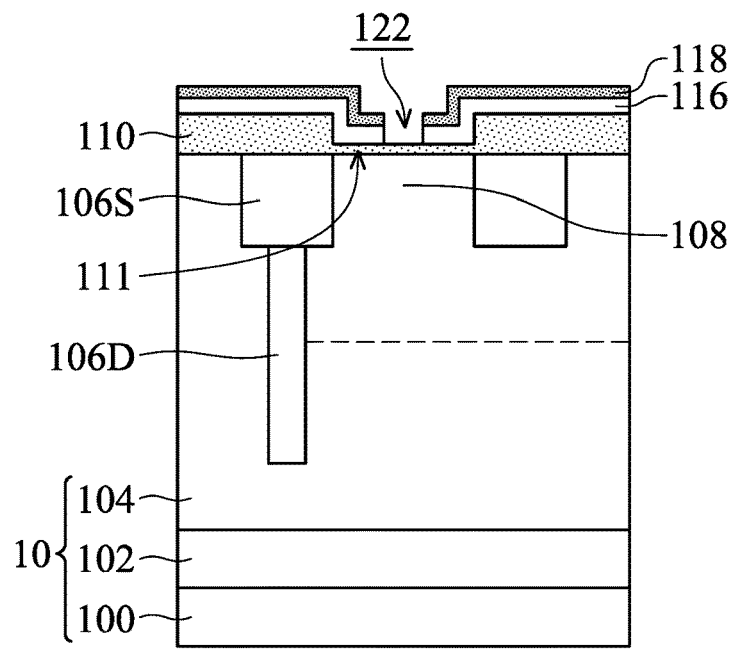

As shown in FIG. 1D, the protective layer 118 and the base semiconductor layer 116 are patterned to form an opening 122, in accordance with some embodiments. The opening 122 exposes the recessed portion 111 of the insulating layer 110 below the bottom of the opening 122. The protective layer 118 and the base semiconductor layer 116 may be patterned using an etching process with the mask layer 120 as an etching mask. The etching process may be a dry etching process. Afterwards, the mask layer 120 is removed.

The opening 122 may be used to contain a semiconductor element that will be formed later. Because the opening 122 is defined using the mask layer 120, the width and position of the opening 122 may be well-controlled. Therefore, the width and position of the semiconductor element are also well-controlled.

In some embodiments, the insulating layer 110 is made of a different material than that of the protective layer 118 or the base semiconductor layer 116. Therefore, the recessed portion 111 of the insulating layer 110 may prevent the collector element 108 from being damaged by the etching process for patterning the protective layer 118 and the base semiconductor layer 116.

Afterwards, the recessed portion 111 exposed by the opening 122 is removed to expose the collector element 108, in accordance with some embodiments. An etching process may be used to remove the exposed portion of the recessed portion 111. For example, a dilute hydrofluoric acid (DHF) solution may be used to remove the exposed portion of the recessed portion 111.

Figure 1E:
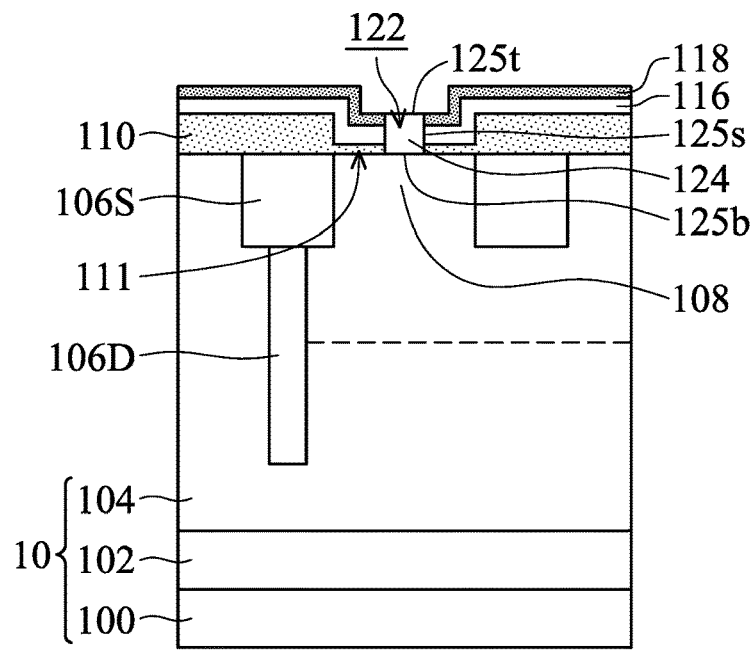

Afterwards, a semiconductor element 124 is formed in the opening 122, as shown in FIG. 1E in accordance with some embodiments. In some embodiments, the semiconductor element 124 contains silicon and germanium. In some embodiments, the semiconductor element 124 is made of or includes silicon germanium.

In some embodiments, the semiconductor element 124 is formed using a selective epitaxial growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, another applicable process, or a combination thereof.

In some embodiments, the semiconductor element 124 is in direct contact with the collector element 108. In some embodiments, the semiconductor element 124 is in direct contact with the base semiconductor layer 116. As shown in FIG. 1E, the semiconductor element 124 has a top surface 125$t$, a bottom surface 125$b$, and a side surface 125$s$. In some embodiments, the base semiconductor layer 116 extends along the side surface 125$s$ of the semiconductor element 124. In some embodiments, the side surface 125$s$ of the semiconductor element 124 is in direct contact with the base semiconductor layer 116. In some embodiments, the bottom surface 125$b$ of the semiconductor element 124 is in direct contact with the collector element 108.

Figure 1F:
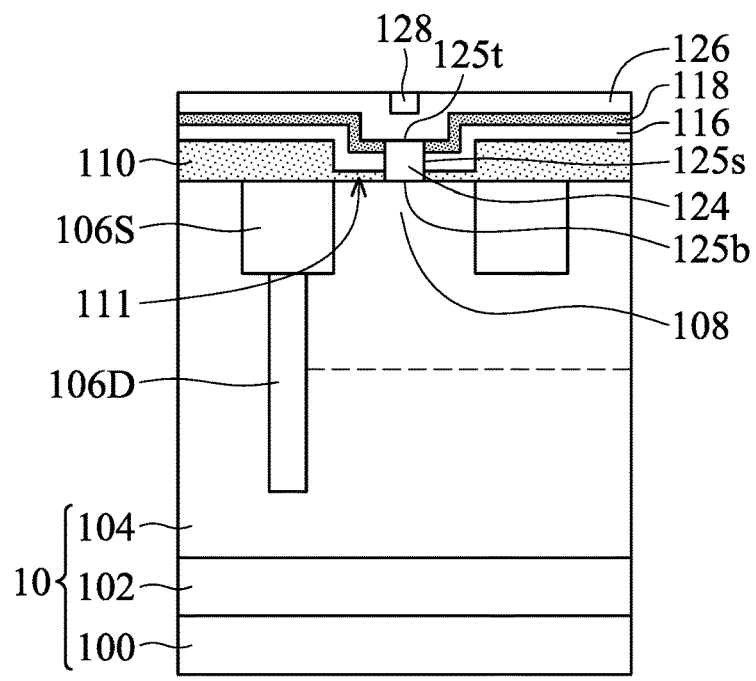

As shown in FIG. 1F, an emitter semiconductor layer 126 is deposited over the protective layer 118 and the semiconductor element 124, in accordance with some embodiments. In some embodiments, the emitter semiconductor layer 126 is made of or includes polysilicon. In some embodiments, the emitter semiconductor layer 126 is an n-type doped polysilicon layer for an NPN bipolar junction transistor. In some other embodiments, the emitter semiconductor layer 126 is a p-type doped polysilicon layer for a PNP bipolar junction transistor. In some embodiments, the emitter semiconductor layer 126 is deposited using a CVD process or another applicable process.

In some embodiments, the emitter semiconductor layer 126 surrounds a recess that is filled with a filling layer 128, as shown in FIG. 1F. In some embodiments, the filling layer 128 is an anti-reflection coating film. In some embodiments, the filling layer 128 is made of or includes a photoresist material. The filling layer 128 may be formed using a spin-on process, a spray coating process, another applicable process, or a combination thereof.

Figure 1G:
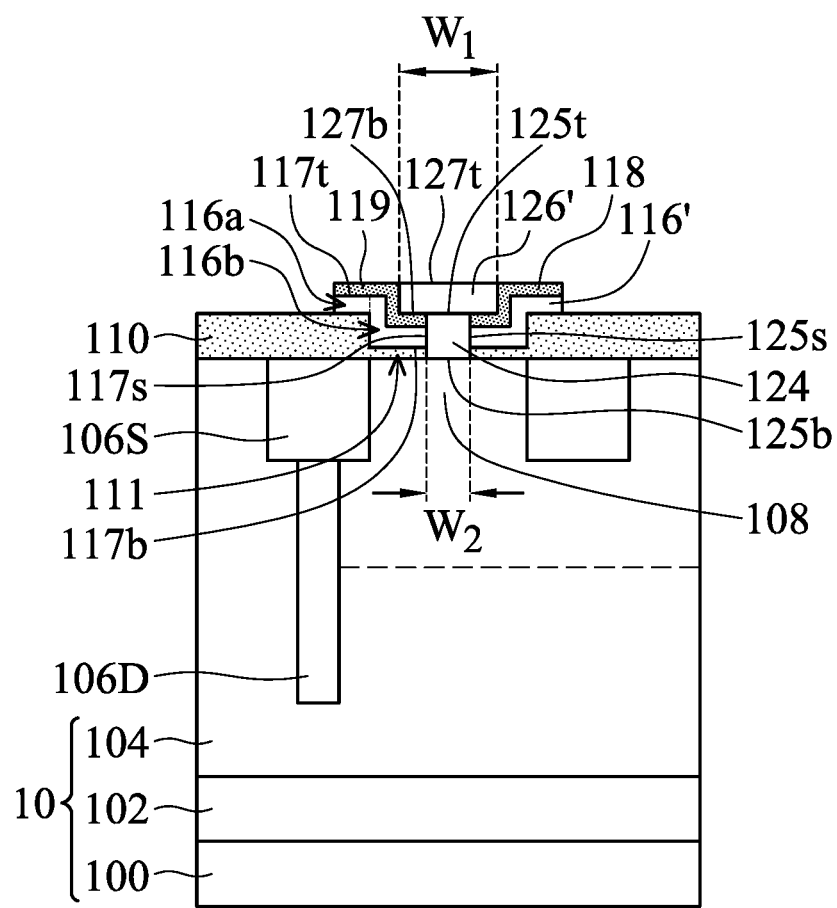

As shown in FIG. 1G, the emitter semiconductor layer 126, the protective layer 118, and the base semiconductor layer 116 are partially removed, in accordance with some embodiments. As a result, the remaining portions of the base semiconductor layer 116 and the emitter semiconductor layer 126 form a base element 116' and an emitter element 126', respectively. One or more photolithography processes and etching processes may be used to form the base element 116' and the emitter element 126'.

In some embodiments, an isotropic etching process is used to partially remove the emitter semiconductor layer 126 until the protective layer 118 is exposed. Afterwards, a patterned photoresist layer is used to assist in the partial removal of the emitter semiconductor layer 126 and the base semiconductor layer 116. As a result, the base element 116' and the emitter element 126' are formed. Afterwards, the patterned photoresist layer is removed.

In some embodiments, the emitter element 126' is n-type doped, the base element 116' is p-type doped, and the collector element 108 is n-type doped. In some embodiments, the emitter element 126' has a greater doping concentration than that of the collector element 108. In some embodiments, the base element 116' has a greater doping concentration than that of the collector element 108. The doping concentration of the base element 116' is lower than that of the emitter element 126'.

In some embodiments, as shown in FIG. 1G, the emitter element 126' has a substantially flat (or planar) top surface 127t. In some embodiments, the top surface 127t of the emitter element 126' is substantially coplanar with the top surface 119 of the protective layer 118. In some embodiments, because the top surface 127t of the emitter element 126' is substantially flat, the subsequent formation of a conductive contact to the emitter element 126' becomes easier to perform.

The formation of the conductive contact may involve forming a metal silicide region on the emitter element 126'. Because the top surface 127t is substantially flat, the quality of the metal silicide region is ensured. The performance of the emitter element 126' is improved. For example, a current leakage of the emitter element 126' may be reduced or prevented.

As shown in FIG. 1G, the base element 116' has a side surface 117s. In some embodiments, the side surface 117s of the base element 116' extends along the side surface 125s of the semiconductor element 124. In some embodiments, the entirety of the side surface 117s of the base element 116' extends along the side surface 125s of the semiconductor element 124.

In some embodiments, the base element 116' is in direct contact with the side surface 125s of the semiconductor element 124. In some embodiments, the side surface 117s of the base element 116' is in direct contact with the side surface 125s of the semiconductor element 124. In some embodiments, the entirety of the side surface 117s of the base element 116' is in direct contact with the semiconductor element 124. In some embodiments, the entirety of the side surface 117s of the base element 116' is in direct contact with the side surface 125s of the semiconductor element 124. In some embodiments, the contact area between the base element 116' and the semiconductor element 124 is large, which improves the electrical connection between the base element 116' and the semiconductor element 124. The quality and performance of the semiconductor device structure are thus improved.

In some embodiments, the semiconductor element 124 is in direct contact with the collector element 108 and the emitter element 126', as shown in FIG. 1G. However, many variations and/or modifications may be made to embodiments of the disclosure. In some other embodiments, one or more layers or regions are formed between the semiconductor element 124 and the collector element 126'. On or more layers or regions may be formed between the semiconductor element 124 and the collector element 108. In some other embodiments, one or more one or more layers or regions are formed between the semiconductor element 124 and the base element 116'.

As shown in FIG. 1G, the emitter element 126' has a bottom surface 127b opposite to the top surface 127t. The bottom of the emitter element 126' has a width $W_1$, and the top of the semiconductor element 124 has a width $W_2$. In some embodiments, the bottom of the emitter element 126' is wider than the top of the semiconductor element 124. The width $W_1$ is greater than the width $W_2$.

As shown in FIG. 1G, the base element 116' has a first portion 116a and a second portion 116b. In some embodiments, the first portion 116a extends along the top surface of the insulating layer 110. In some embodiments, the second portion 116b extends towards the semiconductor substrate 104 along the side surface of the insulating layer 110.

As shown in FIG. 1G, the base element 116' has a top (such as a top surface 117t) and a bottom (such as a bottom surface 117b). In some embodiments, the top of the semiconductor element 124 (such as the top surface 125t) is higher than the bottom of the base element 116' (such as the bottom surface 117b), with respect to the semiconductor substrate 104. In some embodiments, the top of the semiconductor element 124 (such as the top surface 125t) is lower than the top of the base element 116' (such as the top surface 117t), with respect to the semiconductor substrate 104. In some embodiments, the bottom surface 117b of the base element 116' is higher than the bottom surface 125b of the semiconductor element 124, with respect to the semiconductor substrate 104. In some embodiments, the bottom surface 117b of the base element 116' is lower than the top surface 125t of the semiconductor element 124, with respect to the semiconductor substrate 104. In some embodiments, the emitter element 126' does not penetrate through the base element 116', as shown in FIG. 1G.

In some embodiments, the semiconductor element 124 has a substantially vertical sidewall. However, embodiments of the disclosure are not limited thereto. Many variations and/or modifications can be made to embodiments of the disclosure.

Figure 2A:
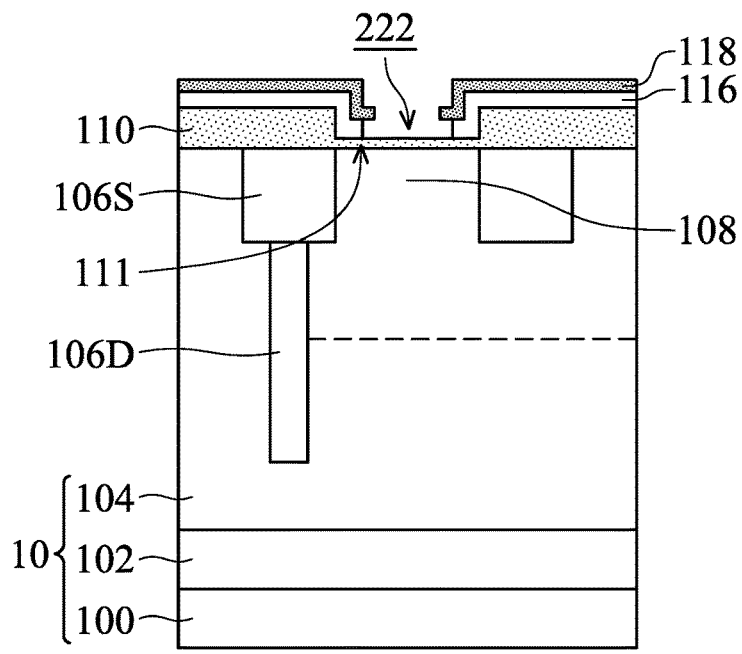
FIGS. 2A-2D are cross-sectional views of various stages of a process for forming a semiconductor device structure, in accordance with some embodiments.

FIGS. 2A-2D are cross-sectional views of various stages of a process for forming a semiconductor device structure, in accordance with some embodiments. As shown in FIG. 2A, a structure similar to or the same as that shown in FIG. 1D is received or provided. In some embodiments, an etching process is used to partially remove the base semiconductor layer 16, as shown in FIG. 2A. As a result, the base semiconductor layer 16 is retreated from an edge of the protective layer 118. An opening 222 which is larger than the opening 122 is thus formed.

Figure 2B:
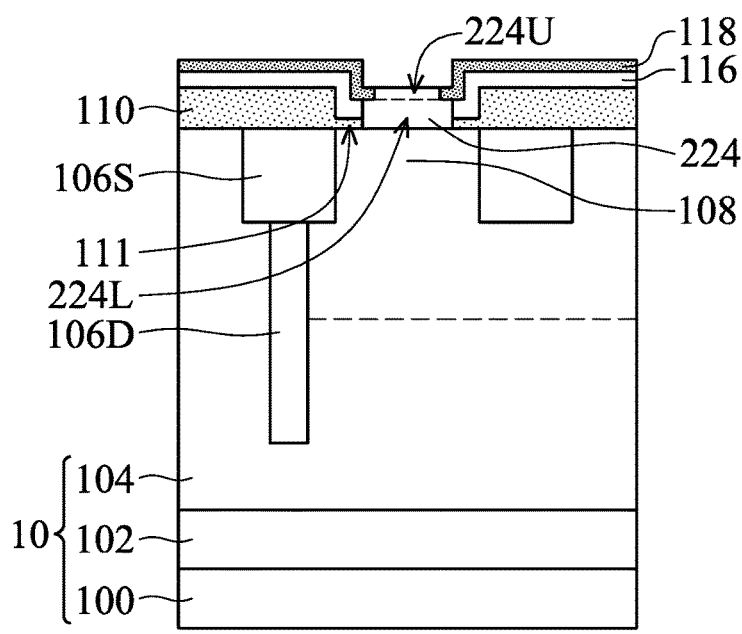

As shown in FIG. 2B, a semiconductor element 224 is formed in the opening 222, in accordance with some embodiments. The material and formation method of the semiconductor element 224 may be similar to or the same as those of the semiconductor element 124. As shown in FIG. 2B, the semiconductor element 224 has an upper portion 224U and a lower portion 224L. In some embodiments, the lower portion 224L is wider than the upper portion 224U.

Figure 2C:
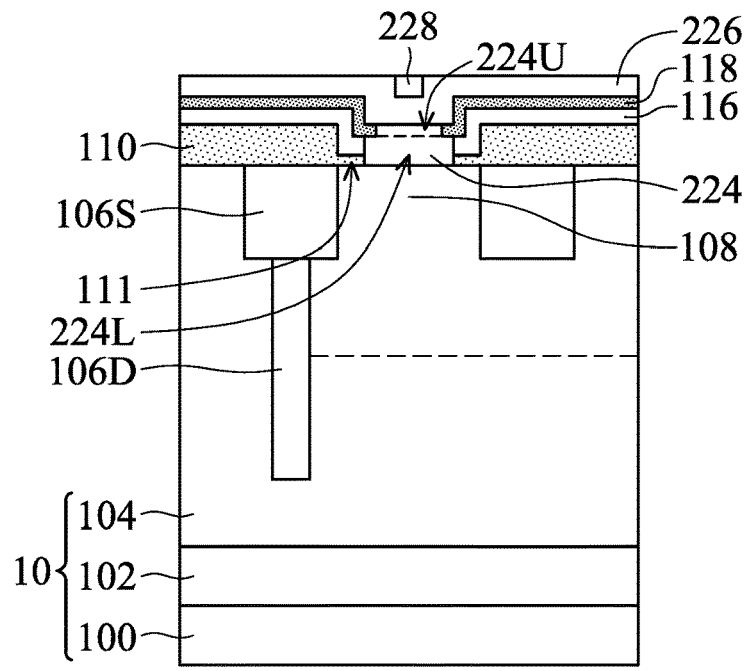

As shown in FIG. 2C, an emitter semiconductor layer 226 is deposited over the protective layer 118 and the semiconductor element 224, in accordance with some embodiments. The material and formation method of the emitter semiconductor layer 226 may be similar to or the same as those of the emitter semiconductor layer 126.

Afterwards, a filling layer 228 is formed to fill a recess that is surrounded by the emitter semiconductor layer 226, as shown in FIG. 2C in accordance with some embodiments. The material and formation method of the filling layer 228 may be similar to or the same as those of the filling layer 128.

Figure 2D:
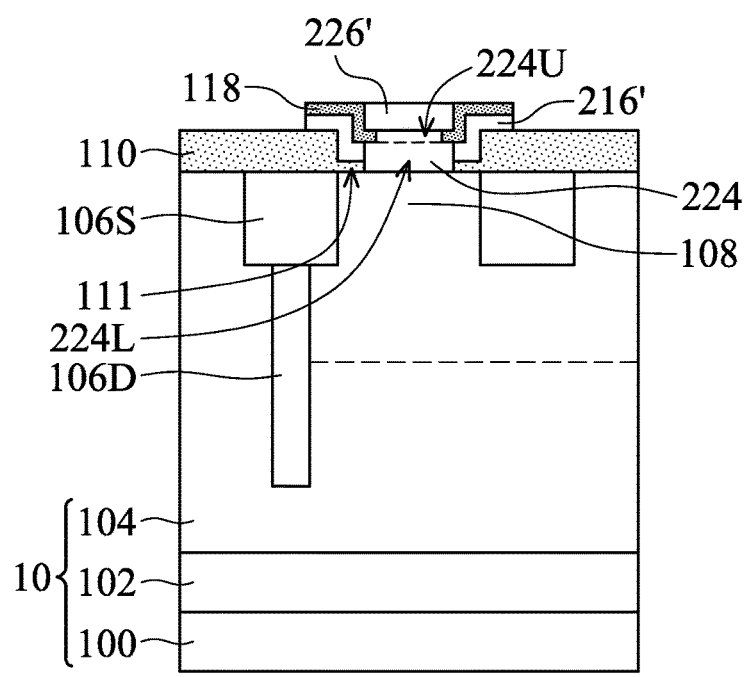

As shown in FIG. 2D, the emitter semiconductor layer 226, the protective layer 118, and the base semiconductor layer 116 are patterned, in accordance with some embodiments. As a result, an emitter element 226' and a base element 216' are formed. In some embodiments, a method similar to or the same as that illustrated in FIG. 1G is used to pattern the emitter semiconductor layer 226, the protective layer 118, and the base semiconductor layer 116.

Many variations and/or modifications can be made to embodiments of the disclosure. In some embodiments, the semiconductor device structure includes an NPN bipolar junction transistor and a PNP bipolar junction transistor.

Figure 3:
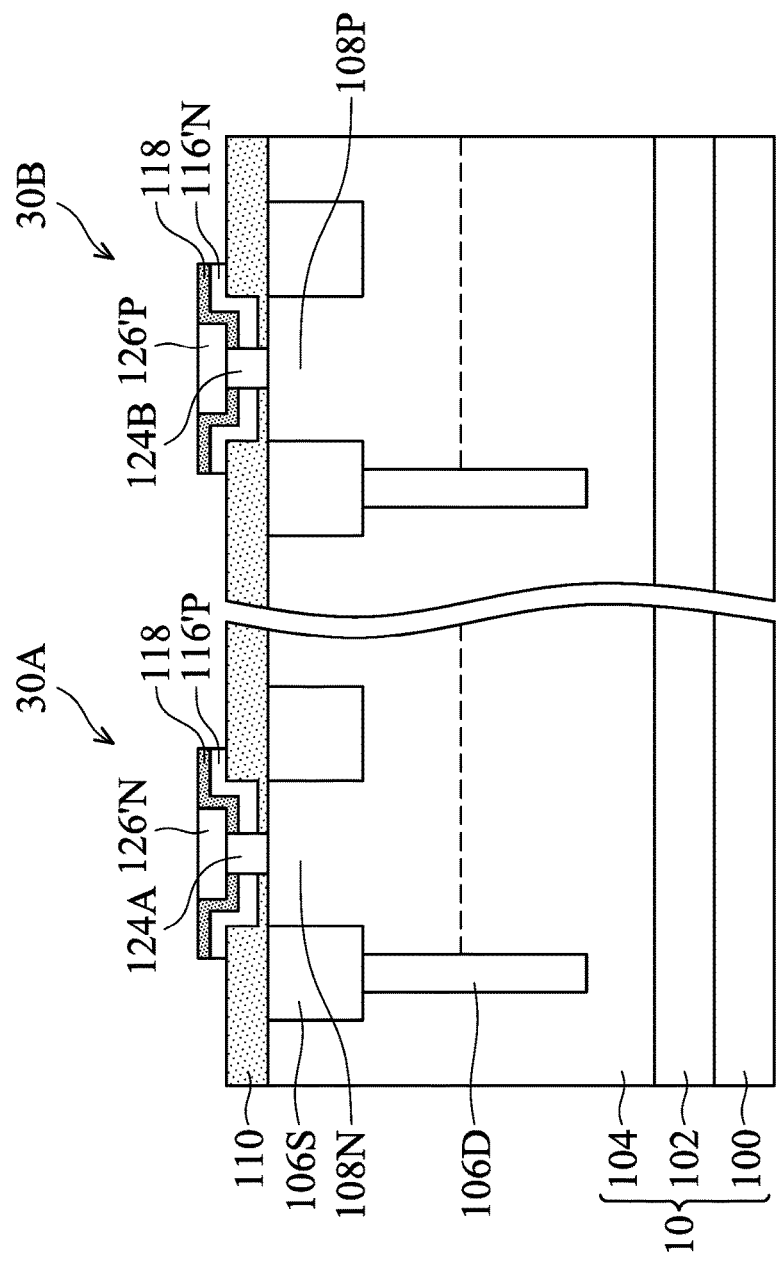
FIG. 3 is a cross-sectional view of a semiconductor device structure, in accordance with some embodiments.

FIG. 3 is a cross-sectional view of a semiconductor device structure, in accordance with some embodiments. As shown in FIG. 3, a semiconductor device structure including an NPN bipolar junction transistor 30A and a PNP bipolar junction transistor 30B is formed, in accordance with some embodiments. The method illustrated in FIGS. 1A-1G or FIGS. 2A-2D may be used to form the semiconductor device structure shown in FIG. 3.

In some embodiments, the NPN bipolar junction transistor 30A includes an emitter element 126'N, a base element 116'P, a collector element 108N, and a semiconductor element 124A. In some embodiments, the PNP bipolar junction transistor 30B includes an emitter element 126'P, a base element 116'N, a collector element 108P, and a semiconductor element 124B.

In some embodiments, each of the semiconductor elements 124A and 124B contains silicon and germanium. In some embodiments, the semiconductor element 124A has a greater germanium concentration than that of the semiconductor element 124B.

However, embodiments of the disclosure are not limited thereto. In some other embodiments, the semiconductor element 124A has a lower germanium concentration than that of the semiconductor element 124B.

In some embodiments, the top surface 125t of the semiconductor element 124 is substantially coplanar with the bottom surface 127b of the emitter element 126'. However, many variations and/or modifications can be made to embodiments of the disclosure.

Figure 4:
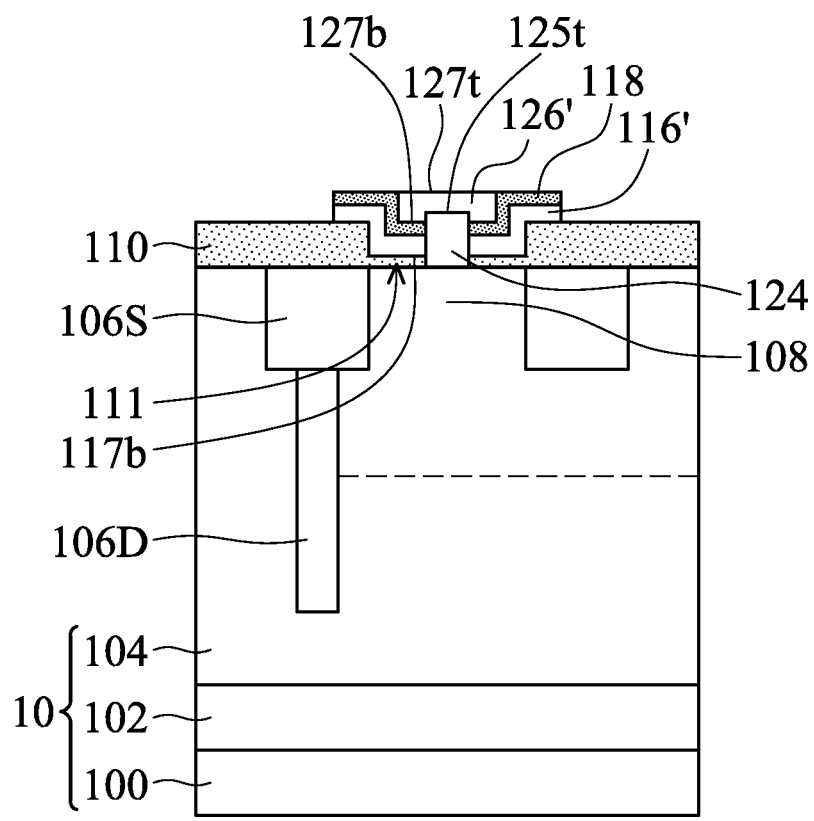
FIG. 4 is a cross-sectional view of a semiconductor device structure, in accordance with some embodiments.

FIG. 4 is a cross-sectional view of a semiconductor device structure, in accordance with some embodiments. In some embodiments, a structure similar to that shown in FIG. 1G is formed. In some embodiments, the semiconductor element 124 is formed to have a greater thickness. As a result, the semiconductor element 124 protrudes from a surface of the protective layer 118, as shown in FIG. 4. After the emitter element 126' is formed, the protruding portion of semiconductor element 124 extends into the emitter element 126'. The semiconductor element 124 protrudes from the bottom surface 127b of the emitter element 126', as shown in FIG. 4.

Figure 5:
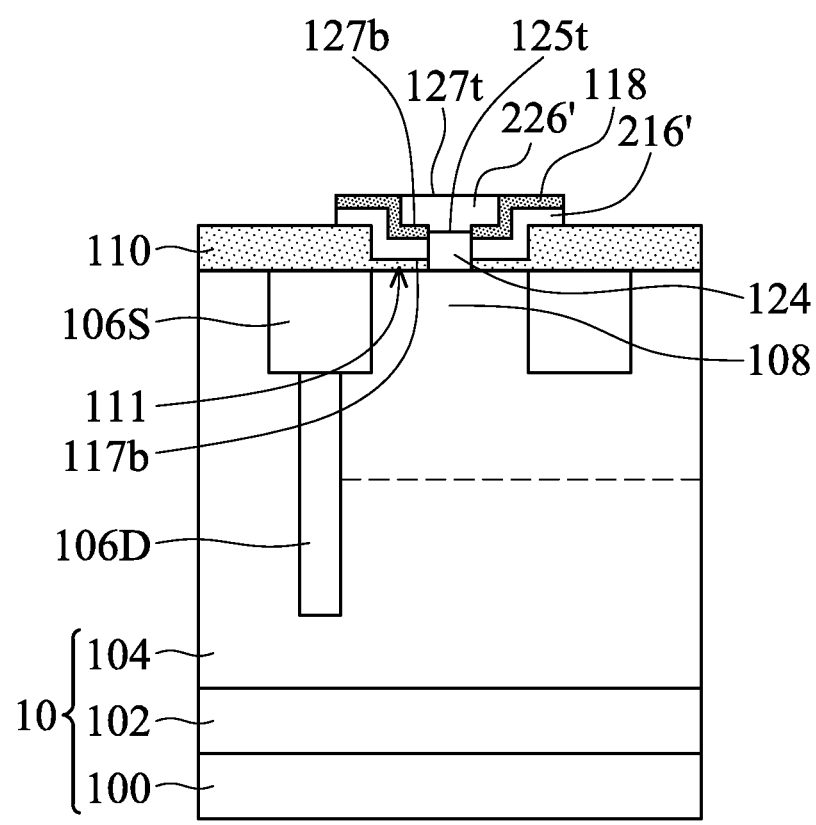
FIG. 5 is a cross-sectional view of a semiconductor device structure, in accordance with some embodiments.

FIG. 5 is a cross-sectional view of a semiconductor device structure, in accordance with some embodiments. In some embodiments, a structure similar to that shown in FIG. 2D is formed. In some embodiments, the top surface 125t of the semiconductor element 124 is between a bottom surface and an upper surface of the protective layer 118. The emitter element 226' has a narrower portion extending towards the semiconductor element 124. In some embodiments, the narrower portion of the emitter element 226' does not penetrate through the protective layer 118.

Embodiments of the disclosure form semiconductor device structure with one or more bipolar junction transistors. Each of the bipolar junction transistors has an emitter element, a base element, a collector element, and a semiconductor element. The semiconductor element is between the emitter element and the collector element, and is surrounded by the base element. The base element extends along (or is in direct contact with) a side surface of the semiconductor element. Electrical connection between the semiconductor element and the base element is good due to there being a larger contact area between the semiconductor element and the base element. Therefore, the quality and performance of the semiconductor device structure are significantly improved.

In accordance with some embodiments, a semiconductor device structure is provided. The semiconductor device structure includes a collector element formed in or over a semiconductor substrate. The semiconductor device structure also includes a semiconductor element over the collector element, and the semiconductor element has a top surface, a bottom surface, and a side surface. The semiconductor device structure further includes an emitter element over the top surface of the semiconductor element. In addition, the semiconductor device structure includes a base element over the collector element and in direct contact with the side surface of the semiconductor element.

In accordance with some embodiments, a semiconductor device structure is provided. The semiconductor device structure includes a collector element formed in or over a semiconductor substrate. The semiconductor device structure also includes a semiconductor element over the collector element, and the semiconductor element has a top surface, a bottom surface, and a side surface. The semiconductor device structure further includes an emitter element over the top surface of the semiconductor element. In addition, the semiconductor device structure includes a base element over the collector element and extends along the side surface of the semiconductor element.

In accordance with some embodiments, a semiconductor device structure is provided. The semiconductor device structure includes a collector region formed in a semiconductor substrate. The semiconductor device structure also includes a semiconductor element over the collector region, and the semiconductor element has a top surface, a bottom surface, and a side surface. The semiconductor device structure further includes an emitter element over the top surface of the semiconductor element. In addition, the semiconductor device structure includes a base element over the semiconductor substrate. The base element has a side surface, and an entirety of the side surface of the base element is in direct contact with the semiconductor element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a collector element formed in or over a semiconductor substrate;
   a semiconductor element over the collector element, wherein the semiconductor element has a top surface, a bottom surface, and a side surface;
   an emitter element over the top surface of the semiconductor element; and
   a base element over the collector element and in direct contact with the side surface of the semiconductor element.

2. The semiconductor device structure as claimed in claim 1, wherein the base element has a side surface, and an entirety of the side surface of the base element is in direct contact with the side surface of the semiconductor element.

3. The semiconductor device structure as claimed in claim 1, wherein the base element is p-type doped, the emitter element is n-type doped, and the collector element is n-type doped.

4. The semiconductor device structure as claimed in claim 1, wherein the semiconductor element contains silicon and germanium.

5. The semiconductor device structure as claimed in claim 1, wherein the semiconductor element is in direct contact with the collector element and the emitter element.

6. The semiconductor device structure as claimed in claim 1, wherein a width of a bottom of the emitter element is greater than a width of a top of the semiconductor element.

7. The semiconductor device structure as claimed in claim 1, further comprising:
   a first insulating layer between the collector element and the base element; and
   a second insulating layer between the base element and the emitter element.

8. The semiconductor device structure as claimed in claim 1, further comprising an insulating layer over the semiconductor substrate, wherein the base element has a first portion and a second portion, the first portion extends along a top surface of the insulating layer, and the second portion extends towards the semiconductor substrate along a side surface of the insulating layer.

9. The semiconductor device structure as claimed in claim 1, wherein the emitter element has a substantially flat top surface.

10. The semiconductor device structure as claimed in claim 1, wherein a top of the semiconductor element is higher than a bottom of the base element and lower than a top of the base element.

11. The semiconductor device structure as claimed in claim 1, further comprising:
   a second collector element formed in or over the semiconductor substrate;
   a second semiconductor element over the second collector element, wherein the second semiconductor element has a second top surface, a second bottom surface, and a second side surface;
   a second emitter element over the second top surface of the second semiconductor element; and
   a second base element over the second collector element and in direct contact with the second side surface of the second semiconductor element, wherein the second base element is n-type doped, and the base element is p-type doped.

12. The semiconductor device structure as claimed in claim 11, wherein the semiconductor element has a greater germanium concentration than that of the second semiconductor element.

13. The semiconductor device structure as claimed in claim 1, wherein the semiconductor element has an upper portion and a lower portion, and the lower portion is wider than the upper portion.

14. A semiconductor device structure, comprising:
   a collector element formed in or over a semiconductor substrate;
   a semiconductor element over the collector element, wherein the semiconductor element has a top surface, a bottom surface, and a side surface;
   an emitter element over the top surface of the semiconductor element; and
   a base element over the collector element and extends along the side surface of the semiconductor element.

15. The semiconductor device structure as claimed in claim 14, wherein the base element has a side surface, and an entirety of the side surface of the base element extends along the side surface of the semiconductor element.

16. The semiconductor device structure as claimed in claim 14, wherein the emitter element has a greater doping concentration than that of the collector element.

17. The semiconductor device structure as claimed in claim 14, wherein a bottom of the emitter element is wider than a top of the semiconductor element.

18. A semiconductor device structure, comprising:
   a collector region formed in a semiconductor substrate;
   a semiconductor element over the collector region, wherein the semiconductor element has a top surface, a bottom surface, and a side surface;
   an emitter element over the top surface of the semiconductor element; and
   a base element over the semiconductor substrate, wherein the base element has a side surface, and an entirety of the side surface of the base element is in direct contact with the semiconductor element.

19. The semiconductor device structure as claimed in claim 18, wherein a bottom surface of the base element is higher than the bottom surface of the semiconductor element, and the bottom surface of the base element is lower than the top surface of the semiconductor element.

20. The semiconductor device structure as claimed in claim 18, wherein the emitter element does not penetrate through the base element.

* * * * *